United States Patent [19]
Saari

[11] 3,739,293
[45] June 12, 1973

[54] MONOLITHIC INTEGRATED CIRCUIT OPERATIONAL AMPLIFIER

[75] Inventor: Veikko Reynold Saari, Spring Lake Heights, N.J.

[73] Assignee: Bell Telephone Laboratories, Incorporated, Murray Hill, N.J.

[22] Filed: Nov. 24, 1971

[21] Appl. No.: 201,669

[52] U.S. Cl. .................... 330/30 D, 330/19, 330/69
[51] Int. Cl. .............................................. H03f 3/68
[58] Field of Search .................... 330/19, 30 D, 69, 330/151

[56] References Cited
UNITED STATES PATENTS

| | | | |
|---|---|---|---|
| 3,569,849 | 3/1971 | Cassidy et al. | 330/30 D X |
| 3,408,586 | 10/1968 | Ordower | 330/151 X |

*Primary Examiner*—Roy Lake
*Assistant Examiner*—Lawrence J. Dahl
*Attorney*—W. L. Keefauver

[57] ABSTRACT

A monolithic integrated circuit operational amplifier has a Darlington connected differential amplifier input stage. The emitters of the differential amplifier are connected to a negative current source and the collectors are connected through resistors to the emitters of first and second common base transistors. The resistor in the emitter of the second common base transistor has a cross-coupled amplifier circuit in parallel with it. The collector of the first common base transistor is connected to a positive voltage source and the collector of the second is connected to a positive current source which is locked to the negative current source. This collector is also connected to the output of the circuit through a Darlington amplifier, a voltage level shift circuit, and a common-emitter transistor.

10 Claims, 4 Drawing Figures

MONOLITHIC INTEGRATED CIRCUIT OPERATIONAL AMPLIFIER

BACKGROUND OF THE INVENTION

This invention relates to operational amplifiers and, more particularly, to wideband monolithic integrated circuit operational amplifiers.

During the past few years the design of integrated circuit operational amplifiers has generally followed certain established principles. A detailed discussion of these circuits can be found in *Fairchild Semiconductor Linear Integrated Circuits Applications Handbook* (1967) by James N. Giles, pages 33 to 72. This type of circuit usually has a differential amplifier input stage followed by a common emitter stage. The output of the common emitter stage is then level shifted and used to drive either a single transistor or a complementary Class B output stage.

This type of integrated circuit operational amplifier usually has a limited bandwidth and slew rate, where slew rate is defined as the maximum voltage change the circuit is capable of making in a fixed amount of time, e.g., V/$\mu$s. The relatively low bandwidth and slew rate are generally due to the low bias currents which are required for low input offset in the input stages of the amplifier. Input offset is the amount of input voltage required at the input to produce a zero output voltage. In an ideal amplifier this would be zero. However, due to the unavoidable mismatch that exists between components in a practical circuit, this voltage exists. It is usually compensated with a biasing network but its effect can change with temperature and supply voltage. The low bias currents in the input stages of the amplifier prevent large amounts of charge from being moved in a short period of time. This prevents large rapid voltage changes at the output and causes the amplifier frequency response to roll off at a relatively low value. It is, therefore, an object of this invention to provide a new monolithic integrated circuit operational amplifier which has an extremely high slew rate, a wide bandwidth and a stable input offset.

SUMMARY OF THE INVENTION

The present invention is directed to increasing the bandwidth and slew rate, and maintaining a low input offset sensitivity in a monolithic integrated circuit operational amplifier by using feed-forward techniques and locked current supplies.

In an illustrative embodiment of the invention, the input stage of the circuit is a differential amplifier formed with two Darlington connected transistor pairs. The input signal is applied to the input base of the first transistor pair and the input base of the second transistor pair is grounded. The emitters of the differential amplifier are connected to a conventional negative current source. The differential output signals, of the input stage, which are taken from the collectors of the first and second transistor pairs, are applied to the emitters of first and second common-base-connected transistors through first and second resistors, respectively. The collector of the first common-base transistor is connected to a voltage supply, and the collector of the second common-base transistor is connected to a positive current supply, which is locked to the negative current supply of the input stage. A cross-coupled transistor amplifier is arranged in parallel with the second resistor. This circuit samples the signal at the collector of the second transistor pair and supplies an additional current to the second common-base transistor in response to it.

The collector of the second common-base transistor is also connected to a Darlington amplifier circuit which is driving a voltage level shift circuit. The output of the amplifier is taken from a single common emitter transistor connected to the output of the voltage level shift circuit.

As was mentioned previously, the positive current source, connected to the collector of the second common-base transistor, is locked to the negative current source of the input differential circuit. This locking arrangement allows the input offset to be maintained at a small value once the circuit has been adjusted.

Capacitors are connected from the input of the circuit to the emitter of the second common-base transistor and from the collector of the second common-base transistor to the base of the output transistor. These "feed forward" capacitors allow high frequencies to bypass the input stage and the Darlington stage of the amplifier. This feed-forward feature of the amplifier allows for high slew rates and wide bandwidths, providing the means for rapid transfer of large amounts of charge to the base of the output transistor.

The foregoing and other features of the present invention will be more readily apparent from the following detailed description and drawings.

DETAILED DESCRIPTION

Figure 1:
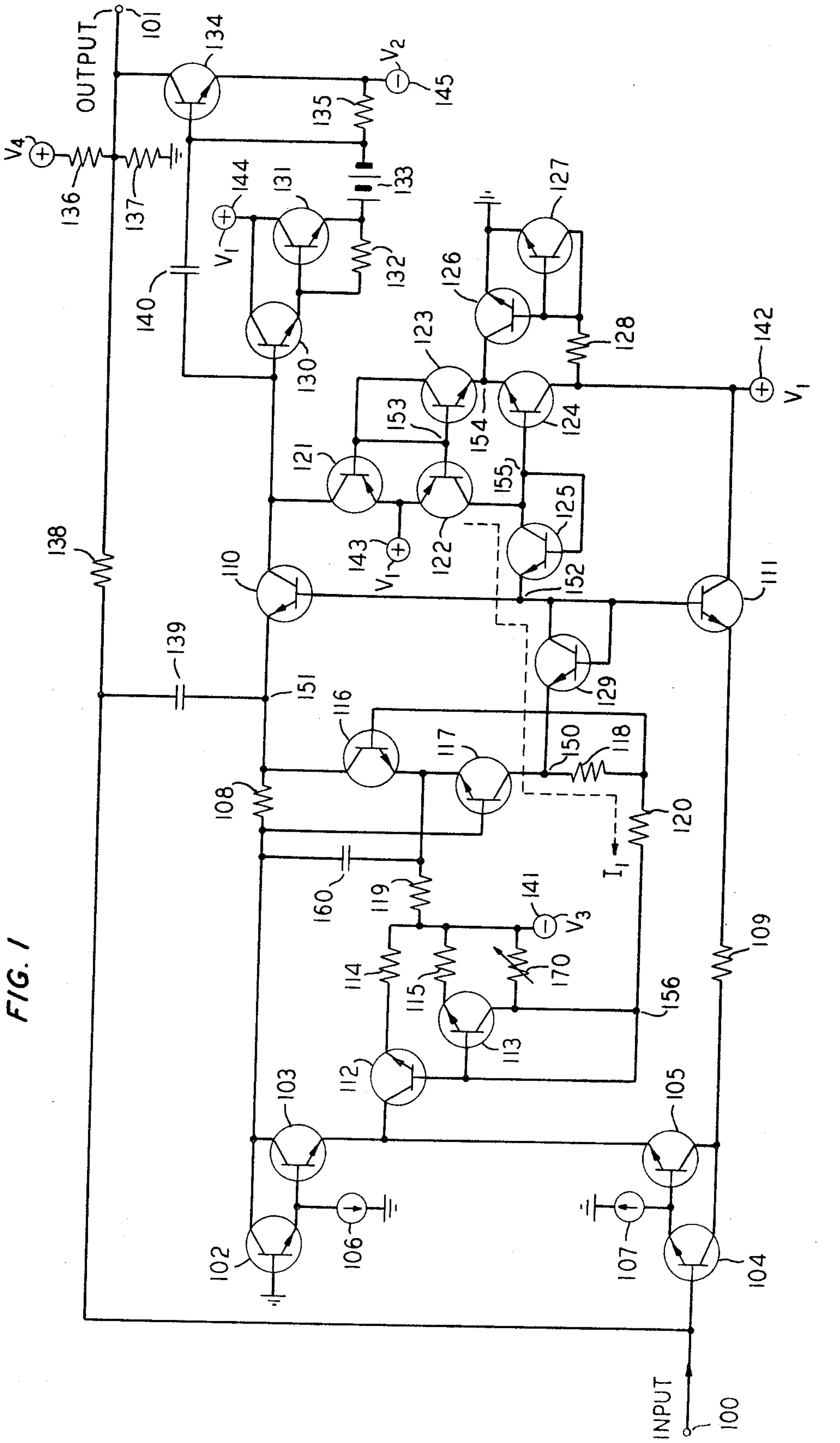
FIG. 1 is an illustrative embodiment of the invention.

A simplified schematic of an illustrative embodiment of the invention is shown in FIG. 1. This Figure is provided in order to avoid some of the complexity in the complete schematic shown in FIGS. 2A and 2B. The input stage of the circuit is a differential amplifier which uses Darlington connected transistor pairs. The first of these pairs consists of transistors 104 and 105. The input to this first pair, which is the base of transistor 104, is connected to the circuit input, and the output is taken from the common collector point of the two transistors (104 and 105). The signal at the emitter of transistor 104 is applied to the base of transistor 105 and a current source 107 is provided to draw off the emitter current of transistor 104.

The second transistor pair consists of transistors 102 and 103, which are connected in a manner similar to transistors 104 and 105. The input of this second transistor pair is grounded and, as in the first transistor pair, its output is taken from the common collector point of the two transistors (102 and 103). A current source 106 is provided as a path for the emitter current of transistor 102. In addition, the emitters of transistors 103 and 105 are connected to the output of a negative current source consisting of transistors 112 and 113. This input stage acts like a conventional differential amplifier with complementary output signals at the collectors of the two transistor pairs. The output of the first transistor pair is applied through resistor 109 to the emitter of transistor 111, which is part of the common base stage of the amplifier. Likewise, the output of the second transistor pair is applied through a resistor 108 to the emitter of transistor 110 of the common base stage of the amplifier.

In the negative current source of the input stage the collector of transistor 112 is connected to the common emitter point of transistors 103 and 105; while its emitter is connected to a negative voltage $V_3$ at terminal 141 through a resistor 114. The base of transistor 112 is connected to the base and collector of transistor 113. In addition, the emitter of transistor 113 is connected to the negative voltage source $V_3$ at terminal 141 through a resistor 115. A variable resistor 170 is provided from the collector of transistor 113 to terminal 141 to act as a balance adjustment for the circuit. This resistor acts to null the initial input offset of the circuit by equalizing the geometric mean of the current densities of the emitter junctions in the two transistor pairs. Since transistors 112 and 113 are part of an integrated circuit, they have substantially the same characteristics. Therefore, the fact that their bases are tied together makes the ratio of the currents through them depend on the ratio of the resistances 114 and 115 and their relative emitter areas. The absolute current through transistor 113 will be equal to the difference between the voltages at terminals 150 and 141, minus the $V_{BE}$ of transistor 113, divided by the sum of the resistances 120, 118 and 115. Therefore, the current $I_1$ through resistance 120 determines the current drawn by transistor 112 from the emitters of transistors 103 and 105; since the difference between its base voltage and the voltage at terminal 141 is determined by the $V_{BE}$ of transistors 113 plus $I_1 R_{115}$. The ratio of the currents through transistors 112 and 113 will also depend partly on their relative emitter areas. Resistors 114 and 115 also help support thermal noise by reducing the noise currents in the mesh containing them and the emitter junctions of transistors 112 and 113.

To provide additional gain in the input section, a cross-coupled amplifier consisting of transistors 115 and 117 is included, in parallel, with resistor 108. The collector of transistor 116 is connected to the emitter of transistor 110 and one side of resistor 108. Also, the base of transistor 117 is connected to the output of the second transistor pair, which is the other side of resistor 108. The emitters of transistors 116 and 117 are connected to each other and through resistor 119 to negative voltage supply $V_3$ at terminal 141. A resistor 118, which has a value substantially the same as resistor 108, is connected between the collector of transistor 117 and the base of transistor 116. In addition, resistor 120 is connected between the base of transistor 116 and the collector of transistor 113 of the negative current source. The voltage at the bases of transistors 110 and 111 is substantially equal to the voltage supply $V_1$ at terminal 143 minus two $V_{BE}$ drops. This can be seen by tracing the series of base-emitter voltage drops (raises) from terminal 143 through terminals 153, 154 and 155 to terminal 152. Therefore, the voltages at the collectors of transistors 116 and 117 remain substantially constant at $V_1 - 3V_{BE}$. Keeping this in mind, the current amplifying properties of the cross-coupled amplifier can be demonstrated. When the second transistor pair draws additional current from transistor 110 through resistance 108 in response to the input signal, the voltage at the base of transistor 117 is reduced. This causes the voltage at the emitters of transistors 116 and 117 to be reduced, thus causing an increase in the collector current of transistor 116, since its base voltage is substantially constant. Therefore, an additional amount of current is drawn from transistor 110 and current gain is achieved.

The common base stage of the amplifier consists of the two common-base connected transistors 110 and 111. The collector of transistor 111 is connected to a positive voltage source $V_1$, located at terminal 142. However, the collector of transistor 110 is connected to a positive current source. As was mentioned previously, the base voltage of transistors 110 and 111 is maintained at a substantially constant voltage $V_1 - 2V_{BE}$. With this arrangement the output of the first transistor pair of the input differential amplifier does not proceed any farther in the circuit. However, the output of the second transistor pair, which was amplified by the cross-coupled amplifier, is passed through the common base transistor 110. These common base transistors provide a low impedance at the collectors of the input differential amplifier which helps to improve its current gain and balance by reducing the signal voltage at the collectors of the transistor pairs. This has the effect of diminishing the internal feedback in the input pairs, which would otherwise limit the circuit gain and upset the balance.

The positive current source connected to the collector of transistor 110 is the same as that disclosed in U.S. Pat. No. 3,624,426 of the present inventor, which issued Nov. 30, 1971. This current source utilizes PNP transistors 121 and 122, which have their emitters connected to voltage $V_1$ at terminal 143 and their bases connected to each other. Since this circuit was designed for use in a monolithic integrated circuit which has been optimized for NPN transistors, these PNP transistors have very low gains. Because of this low gain, these transistors cannot be connected in the same way that the negative current source, consisting of transistors 112 and 113, was connected. Instead, provisions must be made for diverting the large base currents of these low-gain transistors away from the control voltage at terminal 155, while at the same time applying this voltage to the bases of these transistors at terminal 153. This is accomplished by coupling the control voltage at terminal 155 to these bases through transistors 123 and 124. Since the bases and emitters of transistors 121 and 122 are connected together, they will have substantially the same collector current. However, the collector current of transistor 122 will be substantially equal to $$I_1 = (V_1 + V_3 - 4V_{BE}/R_{118} + R_{120} + R_{115}) ;$$

where $V_1$ is the voltage at terminal 143; $V_3$ is the magnitude of the negative voltage at terminal 141; $V_{BE}$ is the base-emitter voltage of the transistors; and $R_{118}$, $R_{120}$ and $R_{115}$ are the resistance values of resistors 118, 120 and 115, respectively. Therefore, transistor 122 has a substantially constant collector current which forces the current at the collector of transistor 121 to be substantially the same constant value.

The collector currents of transistors 121 and 122 would be substantially reduced by the large base currents if terminal 153 were connected directly to terminal 155. The arrangement for diverting this base current and thus preventing it from adding to the collector current of transistor 122, involves connecting the bases of transistors 121, 122 and 123 together. In addition, the collector of transistor 123 is connected to its base.

The emitter of transistor 123 is connected to the emitter of transistor 124. The control voltage at terminal 155 is applied to the base of transistor 124 and its collector is connected to positive voltage source $V_1$, located at terminal 142. A negative current source, consisting of transistors 126 and 127, is used as a sink for the emitter currents of transistors 122 and 123. With this arrangement, the control voltage at terminal 155 is applied to the bases of PNP transistors 121 and 122 through the base-emitter junctions of transistors 123 and 124. However, the large base currents of transistors 121 and 122 pass through transistors 123 and 126 to ground. A resistor 128 is connected between positive voltage source $V_1$ at terminal 142 and the bases of transistors 126 and 127. In addition, the collector of transistor 127 is connected to its base forming a diode. The emitters of transistors 126 and 127 are connected to each other and to ground. Since the bases and emitters of transistors 126 and 127 are tied together, they will have the same collector currents since their emitter areas are nominally the same. However, this collector current is established by the voltage supply $V_1$, the base-emitter drop of transistor 127, and the resistance 128. Therefore, a constant current will be drawn from the emitters of transistors 123 and 124.

The control current flowing into resistance 120 by way of terminal 155 of the positive current source and the control current flowing out of resistance 120 at terminal 156 of the negative current source, consisting of transistors 112 and 113, are one and the same quantity, the path being completed by transistor 125, transistor 129 and resistor 118. Because these control currents are locked together, the outputs of the two current sources will be locked together. This technique for locking current supplies was disclosed in the above-identified patent. In brief, the output current of the positive current source is substantially equal to the collector current of transistor 122. This current, $I_1$, passes along the path indicated in FIG. 1 to terminal 156 of the negative supply and establishes its control voltage. Therefore, an increase in the output of the positive supply will cause a corresponding increase in the output of the negative supply.

This current locking arrangement allows the input offset to be maintained at a small value once the circuit has been adjusted. If the two current sources were not locked and the positive one supplied an increased amount of current, less current would flow through the first transistor pair in the input differential amplifier due to feedback established by resistance 138. Since the total current from the two transistor pairs is controlled by the negative current source, this decreased current would cause an increase in the current through the second transistor pair. This would produce an offset in the input differential amplifier. However, with the two current sources locked together, any change of this nature will be canceled by the negative current source drawing an additional amount of current. This will cause the bias current of both transistor pairs to increase and prevent the offset. In this current locking arrangement, the base and collector of transistor 125 are connected to terminal 155. The emitter of transistor 125 is connected to the base of transistors 129, 110 and 111 at terminal 152. This causes the voltage at terminal 152 to be equal to the supply voltage $V_1$ minus twice $V_{BE}$. Additionally, the collector of transistor 129 is connected to the emitter of transistor 125 in order to provide a path for the current $I_1$. The emitter of transistor 129 is connected to the junction of the collector of transistor 117 and resistor 118 at terminal 150. Also, resistors 118 and 120 are connected in tandem between terminals 150 and 156.

The output of the common base stage of the amplifier at the collector of transistor 110 is applied to a Darlington amplifier consisting of transistors 130 and 131. The collector of transistor 110 is connected to the base of transistor 130; while the collectors of transistors 130 and 131 are connected to the positive voltage source $V_1$, at terminal 144. In addition, the output signal from the common-base stage of the amplifier is coupled to the base of transistor 131 from the emitter of transistor 130. A resistor 132 is provided between the base and emitter of transistor 131 to act as a sink for the emitter current of transistor 130. This Darlington amplifier acts to current amplify the signal without any increase in voltage, so that it will be capable of driving the output stage.

A voltage level shift circuit 133 translates the output voltage at the emitter of transistor 131 to a lower average value and applies it to the base of output transistor 134. A resistor 135 is provided between the base of transistor 134 and its emitter. In addition, the emitter of transistor 134 is connected to negative voltage source $V_2$, at terminal 145. The output of the circuit at terminal 101 is taken from the collector of transistor 134. The collector of transistor 134 is also connected to a positive voltage source $V_4$ through resistor 136 and to ground through a resistor 137.

The arrangement as described to this point is simply an open-loop high-gain differential amplifier with a unique arrangement for reducing offset variations with locked current supplies. The input signal is converted into two amplified complementary signals in the input differential amplifier. One of these signals is current amplified and applied to a common-base stage, which transmits it to a Darlington amplifier. The Darlington amplifier increases the current drive capability of the signal before it is level shifted and used to drive the output stage. However, by providing a resistor 138 between the input of the first transistor pair at terminal 100 and the circuit output at terminal 101, this arrangement will perform as an operational amplifier, with resistor 138 as the feedback resistor.

In order to increase the slew rate and bandwidth of the amplifier, capacitors 139 and 140 bypass the input section of the amplifier and Darlington stage, respectively. The input section normally limits the slew rate because it is biased for low input offset and thus transmits only relatively small signals. Therefore, only small amounts of charge can be moved through it in a short period of time.

With this capacitor, 139, in place, another capacitor, 160, is needed to bring the voltage gain of the shunted portion of the circuit below unity before the effects of capacitor 139 become substantial. This prevents undue positive feedback around the loop created by capacitor 139, which would cause the circuit to be unstable. The gain is reduced by placing capacitor 160 between the common collector point of the second input transistor pair and the common emitter point of the cross-coupled amplifier. The capacitor 140 allows the Darlington stage and the voltage level shift circuit to be bypassed by the high frequencies. This feedforward technique also helps to increase the stability margins of the amplifier. In effect, these capacitors allow the high frequency portions of the input signal to bypass those stages of the amplifier which have poor frequency response or slew rate.

Figure 2A:
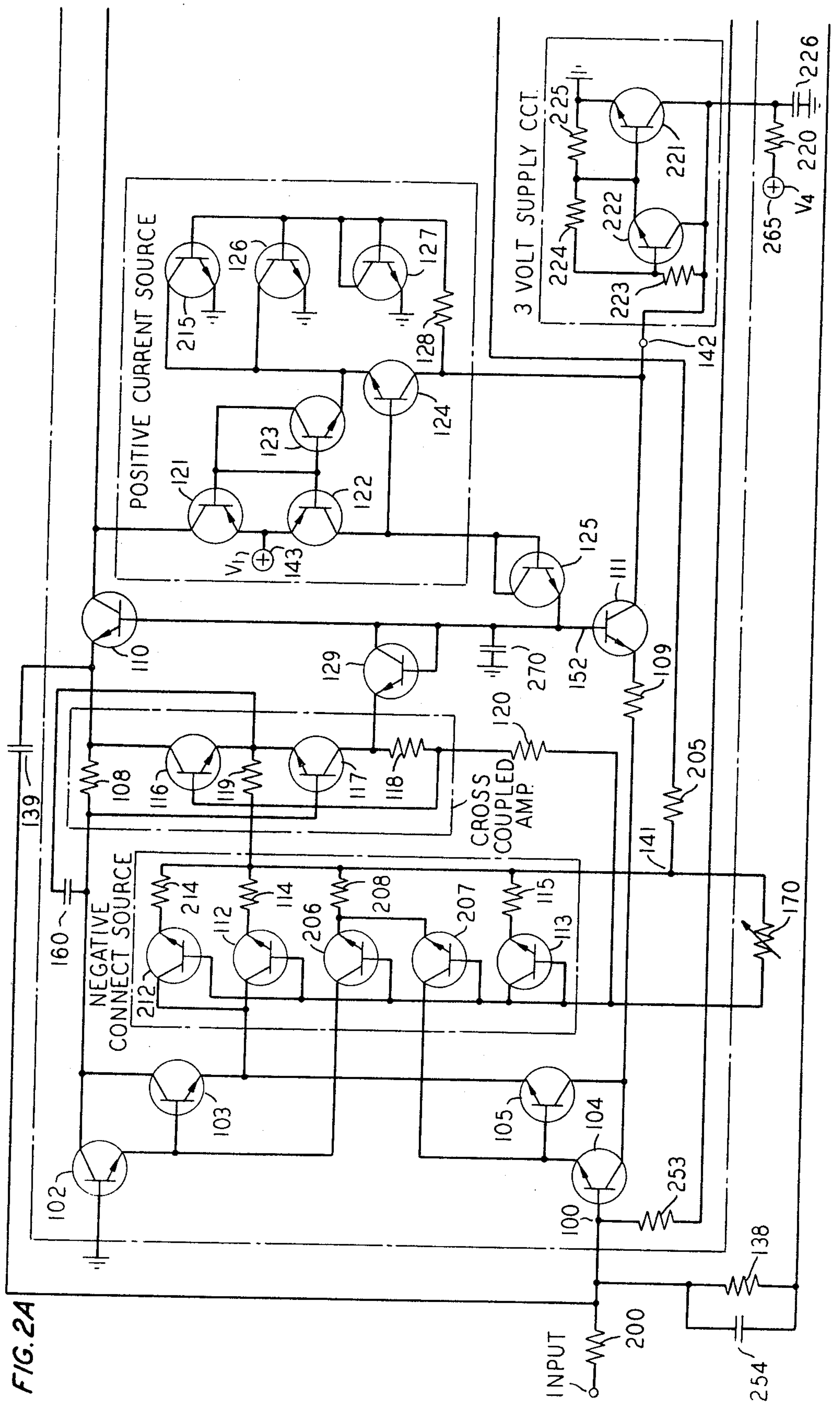
FIGS. 2A and 2B are a more detailed schematic of the circuit of FIG. 1.
Figure 2B:
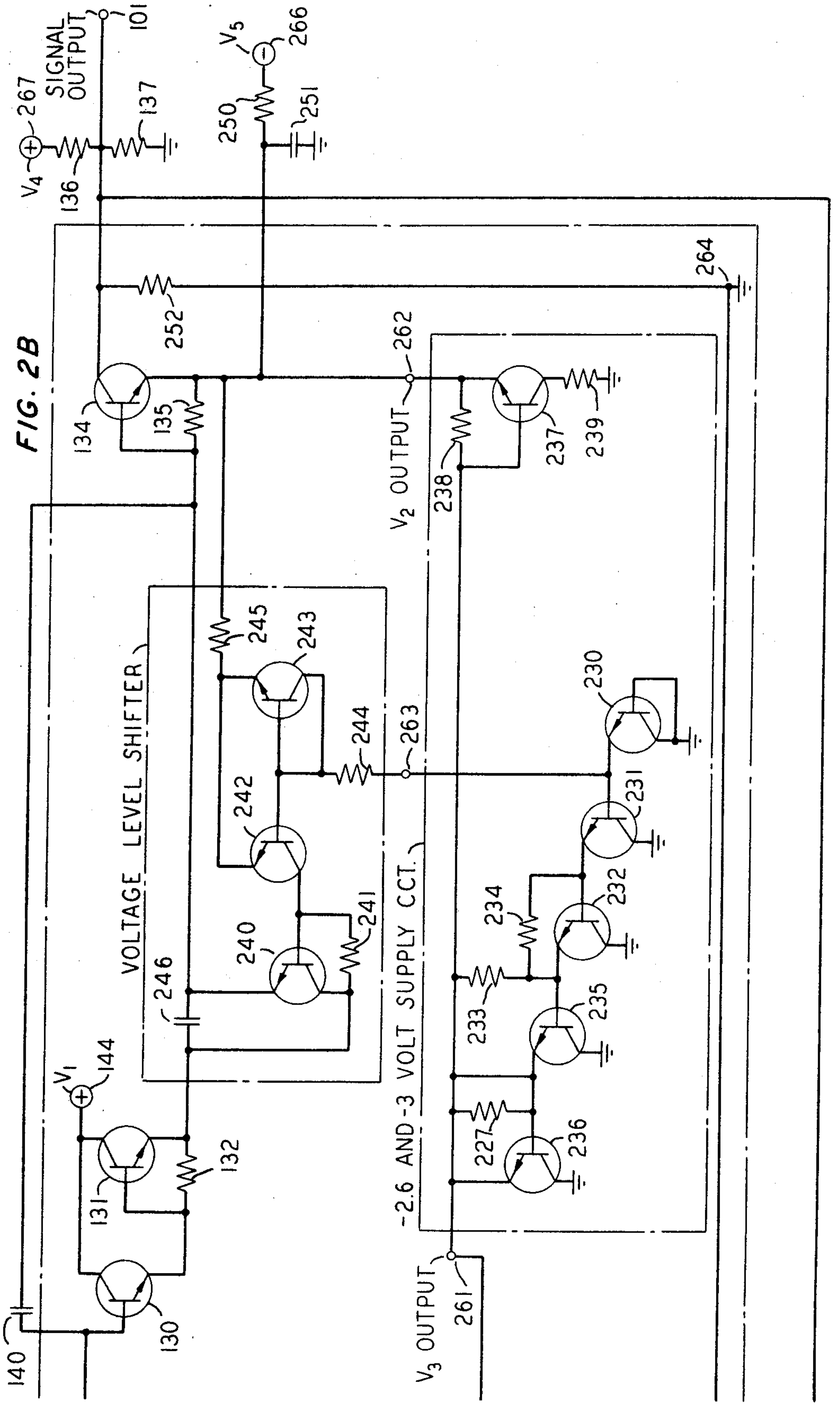

FIGS. 2A and 2B are a complete schematic of an illustrative embodiment of the integrated circuit operational amplifier. Most of the elements are the same as those in FIG. 1 and, consequently, have been given the same reference numbers. The various functional units of the amplifier have been enclosed in broken lines and all of the elements of the actual integrated circuit have been enclosed within a broken line. Those elements which are outside the overall broken line represent external elements which are connected to the integrated circuit.

Referring to FIG. 2A, the current source 106 of FIG. 1 has been replaced with a transistor 206 and a resistor 208. The collector of transistor 206 is connected to the emitter of transistor 102 and its emitter is connected to terminal 141 through resistor 208. The base of transistor 206 is connected to the base of transistor 113. This current source functions in the same manner as the current source comprising transistor 112 and resistor 114. Transistor 113 and resistor 115 establish a control voltage at the base of transistor 206 in response to the current $I_1$ from the positive current source. This control voltage, in turn, establishes the collector current of transistor 206, depending on the value of the resistor 208. Similarly, the current source 107 of FIG. 1 has been replaced by transistor 207, which has its collector connected to the emitter of transistor 104 and its emitter connected to the emitter of transistor 206. This current source functions in the same manner as the current source of transistor 206 since its base is also connected to the base of transistor 206.

The negative current source of FIG. 1 has an increased output current in FIG. 2A because an additional transistor 212 and resistor 214 have been placed in parallel with transistor 112 and resistor 114. The collector of transistor 212 is connected to the collector of transistor 112 and the bases of transistors 112 and 212 have been tied together. The negative voltage at terminal 141 is applied to the emitter of transistor 212 through resistor 214. This voltage is nearly equal to $V_3$ since resistor 203 has a relatively low value.

The positive current source of FIG. 2A is nearly identical to the positive current source in FIG. 1. However, the current sink for transistors 123 and 124 has been increased by connecting a transistor 215 in parallel with transistor 126. These two transistors have their bases, collectors and emitters, respectively, connected to each other.

The voltage supply $V_1$ used throughout the integrated circuit is generated by a voltage source comprising transistors 221 and 222. An external positive voltage is applied at terminal 265. This causes a current to flow through resistor 220, which is connected between terminal 265 and the collector of common base transistor 111. Resistors 223 and 224 are connected between the collector and base, and base and emitter, of transistor 222. The collector of transistor 222 is connected to the collector of transistor 111 and its emitter is connected to the base of transistor 221. A resistor 225 is provided between the base and emitter of transistor 221, and the collector of transistor 221 is connected to the collector of transistor 222. During normal operation the current is drawn through resistor 220 and establishes a voltage at terminal 142. In addition, current is drawn through transistors 221 and 222 because resistor 223 establishes a voltage at the base of transistor 222 and the emitter of transistor 222 establishes a voltage at the base of transistor 221. If an increased amount of current is drawn by the rest of the circuit from terminal 142, there will be a corresponding drop in the voltage at that terminal. This voltage drop will be applied to the bases of transistors 221 and 222, causing these transistors to draw less current. Therefore, the voltage at terminal 142 will be re-established. This operation causes the voltage at terminal 142 to remain at a substantially constant value.

FIG. 2B shows a circuit which provides the negative voltages $V_2$ and $V_3$, which are used throughout the integrated circuit. The voltage $V_3$ is generated from a series of transistors 230, 231, 232, 235 and 236, which have their collectors connected to ground. The base of transistor 230 is also connected to ground and its emitter is connected to the base of transistor 231. Similarly, the emitter of transistor 231 is connected to the base of transistor 232; the emitter of transistor 232 is connected to the base of transistor 235; and the emitter of transistor 235 is connected to the base of transistor 236. A resistor 234 is provided between the base and emitter of transistor 232 to provide a sink for the emitter current of transistor 231. In addition, a resistor 233 is provided between the base and emitter of transistor 235 in order to sink the currents of transistors 231 and 232. The emitter of transistor 235 is connected to the $V_3$ output at terminal 261, as is the emitter of transistor 236. Resistor 227 is connected between the base of transistor 236 and its emitter. However, this resistor is not active in the circuit as shown nor is transistor 236. However, an increase in the voltage $V_3$ can be provided by removing the short across resistor 227. This voltage $V_3$ is made available for use in the negative current source through resistor 205.

The value of output voltage $V_3$ is established by the base emitter drops of the transistors of the series of transistors. However, output voltage $V_2$ is established by connecting the voltage $V_3$ to the base of transistor 237 and taking the output voltage $V_2$ from its emitter. Resistor 238 is provided between the base and emitter of this transistor and a resistor 239 is provided between its collector and ground. In addition, a resistor 250 and the negative voltage $V_5$ at terminal 266 provide a sink for the emitter current of transistors 237 and 134, and the current flowing through resistor 238.

The voltage level shift circuit 133 of FIG. 1 has been replaced with a circuit comprising transistors 240, 242 and 243. This voltage level shift circuit is substantially the same as that disclosed in Patent No. 3,651,350 of the present inventor, which issued March 21, 1972. The collector of transistor 240 is connected to the output of the Darlington circuit at the emitter of transistor 131 and its emitter is connected to the base of the output transistor 134. A resistor 241 is provided between the base and collector of transistor 240. A current source made up of transistors 242 and 243 draws a current through the resistor 241, thereby establishing the base-to-collector voltage drop. The rest of the voltage level shift is made up by the substantially constant base emitter drop of transistor 240. The current source comprising transistors 242 and 243 is arranged in the same manner as the current sink comprising transistors 126 and 127 of the positive current source. In particular, the bases and emitters of transistors 242 and 243 are connected together respectively. The collector of transistor 242 is connected to the base of transistor 240 and the collector of transistor 243 is connected to the base of transistor 242. A resistor 244 is provided between the base of transistor 242 and the emitter of transistor 230 in the negative voltage supply. The negative voltage $V_2$ at terminal 262 is applied to the common emitter point of transistors 242 and 243 through a resistor 245. Since the bases and emitters of transistors 242 and 243 are connected together, they will have nearly the same collector currents. However, the collector current of transistor 243 is determined by the voltage $V_2$, the base-emitter voltage of transistors 230 and 243, and the value of resistors 244 and 245. Therefore, the current drawn through resistor 241 will remain constant. Any increase in temperature will produce a decrease in voltage $V_2$ due to decreases in the base-emitter voltages in the voltage supply circuit. Therefore, the voltage level shift circuit must track this shift in order to properly maintain the bias voltages in other parts of the circuit. The increased temperature will also produce a decrease in the $V_{BE}$ of transistor 240. However, this will be compensated by a decrease in the $V_{BE}$ of the transistors in the current source, which cause an incremental increase in the current in resistor 241. However, this incremental increase is overwhelmed by the much larger decrease in current through resistor 241 caused by the change in $V_2$. This maintains the voltage at the emitter of transistor 131 at a substantially constant value and causes the overall voltage level shift to vary with voltage $V_2$. A capacitor 246 is provided from the collector to the emitter of transistor 240 in order to improve the high frequency response of the voltage level shifter and reduce its noise contribution.

A resistor 200 is provided between the input signal source and the input to the second transistor pair at the base of transistor 104. Also, resistors 252 and 253 are connected in series between the input base of transistor 104 and the circuit output at the collector of transistor 134. These resistors are part of the integrated circuit and act as the feedback resistors. Since they are part of the circuit itself, they allow testing of the circuit without the addition of external feedback resistors. Since these resistors are to be made relatively large in value compared to normal feedback resistors, their effect can be eliminated by grounding their junction point at terminal 264. The normal external feedback resistor 138 is shown with a capacitor 254 in parallel with it. This capacitor is provided to achieve frequency shaping.

Capacitors 226 and 251 provide decoupling for the external voltages $V_4$ and $V_5$ at terminals 142 and 262, respectively. Also, a capacitor 270 provides decoupling for the common base stage at terminal 152.

The following table of values for resistances, capacitances and voltages in the amplifier is given by way of illustration only. These values were used in an amplifier circuit actually built and successfully operated. However, these values should not be construed as limiting the scope of this invention.

TABLE

| | | |
|---|---|---|
| Voltages: | | |
| | $V_1$ | +3 volts |
| | $V_2$ | −3.2 volts |
| | $V_3$ | −2.4 volts |
| | $V_4$ | +8 volts |
| | $V_5$ | −8 volts |
| External resistors: | | |
| | $R_{136}$ | 390 Ω |
| | $R_{137}$ | 250 Ω |
| | $R_{138}$ | 500 Ω |
| | $R_{200}$ | 250 Ω |
| | $R_{220}$ | 220 Ω |
| | $R_{250}$ | 75 Ω |
| Internal Resistors: | | |
| | $R_{108}$ | 400 Ω |
| | $R_{109}$ | 400 Ω |
| | $R_{114}$ | 303 Ω |
| | $R_{115}$ | 345 Ω |
| | $R_{118}$ | 400 Ω |
| | $R_{119}$ | 2.2 KΩ |
| | $R_{120}$ | 4.0 KΩ |
| | $R_{128}$ | 750 Ω |
| | $R_{132}$ | 2.0 KΩ |
| | $R_{135}$ | 1.4 KΩ |
| | $R_{170}$ | Variable |
| | $R_{205}$ | 15 Ω |
| | $R_{208}$ | 2.0 KΩ |
| | $R_{214}$ | 303 Ω |
| | $R_{223}$ | 1300 Ω |
| | $R_{224}$ | 600 Ω |
| | $R_{225}$ | 300 Ω |
| | $R_{233}$ | 2.2 KΩ |
| | $R_{234}$ | 3.3 KΩ |
| | $R_{238}$ | 80 Ω |
| | $R_{239}$ | 1.0 KΩ |
| | $R_{241}$ | 2.1 KΩ |
| | $R_{244}$ | 2.1 KΩ |
| | $R_{245}$ | 100 Ω |
| | $R_{252}$ | 24 KΩ |
| | $R_{253}$ | 10 KΩ |
| External Capacitors: | | |
| | $C_{139}$ | 0.01 μf |
| | $C_{140}$ | 0.001 μf |
| | $C_{160}$ | 0.1 μf |
| | $C_{226}$ | 1 μf |
| | $C_{246}$ | 1 μf |
| | $C_{251}$ | 1 μf |
| | $C_{254}$ | 4.7 pf |
| | $C_{270}$ | 0.001 μf |

Figure 3:
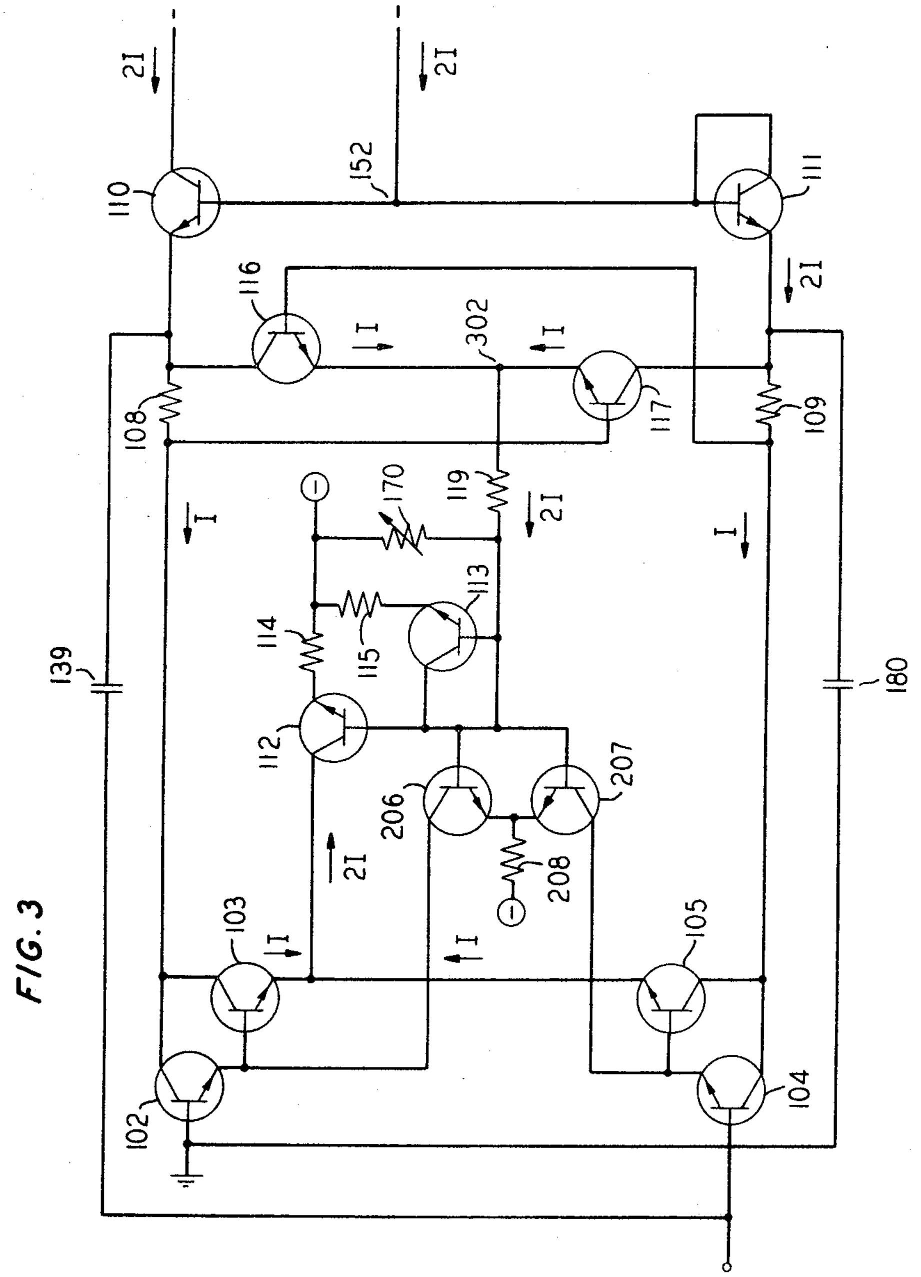
FIG. 3 is an illustrative embodiment of the invention using an alternate form of the cross-coupled amplifier.

FIG. 3 shows an illustrative embodiment of the invention having an alternative connection for the cross-coupled amplifier. Most of the elements of FIG. 3 are the same as those in FIG. 2 and have been given the same numerical designation.

The cross-coupled amplifier, which comprises transistors 116 and 117, has been modified to a more balanced arrangement. The emitter resistor 119 of these transistors is now connected to the base of current source transistor 113 instead of the negative voltage source $V_3$. In addition, transistor 129 and resistors 118 and 120 have been eliminated. Now the collector of transistor 117 is connected to the emitter of transistor 111 and the base of transistor 116 is connected to the collector of transistor 105. With this arrangement the cross-coupled amplifier provides an increased amount of gain. In the arrangement of FIG. 2, the base of transistor 116 had a substantially constant voltage applied to it. However, in this arrangement, the base of transistor 116 has the differential signal from the collector of transistor 105 applied to it. Therefore, transistors 116 and 117 act like a differential amplifier with complementary voltages applied to the two bases. This produces a corresponding increase in the signal current applied to transistor 110 from transistor 116.

The control current from the positive current source which enters node 152 is now channeled through transistor 111, which has been connected as a diode. The current locking feature is still operative with this arrangement because the voltage at terminal 152 is kept within approximately two diode drops of the voltage at terminal 302. The first diode drop occurs across the base emitter junction of transistor 110 and the second drop occurs across the base emitter junction of transistor 117. The bias voltage drop across resistor 108 is usually small compared to these diode drops and can, therefore, be ignored. If the current entering node 152 from the positive current source were applied directly to the base of transistor 113, transistor 111 could have its collector connected to the positive voltage source as in FIG. 2A.

It can be seen from the foregoing that the principles of the present invention allow for the construction of an operational amplifier with improved input offset stability, frequency bandwidth, and slew rate. Although a specific embodiment of this invention has been shown and described, it will be understood that various modifications may be made without departing from the spirit of this invention.

I claim:

1. A transistor amplifier circuit having an input and an output, comprising:
- an input common emitter differential amplifier stage having first and second output terminals, a first input connected to said circuit input and a second input connected to ground;
- a common base stage, comprising first and second transistors arranged in common base configuration with their bases connected to a first reference potential and the collector of the first transistor connected to a second reference potential;
- a first circuit resistance connected between the first output of said differential amplifier stage and the emitter of the first transistor of said common base stage;
- a second circuit resistance connected between the second output of said differential amplifier stage and the emitter of the second transistor of said common base stage;
- a current supply means for controlling a plurality of currents at a plurality of its outputs, a first output of said current supply means being connected to the common emitter connection of said differential amplifier stage and drawing a first current therefrom, a second output of said current supply means being connected to the collector of the second transistor of said common base stage and supplying a second current thereto, said first and second currents being locked together in a substantially constant ratio; and
- an output stage having its input connected to the collector of the second transistor of said common base stage and its output connected to said circuit output.

2. An amplifier circuit as claimed in claim 1 wherein said input common emitter differential amplifier stage comprises:
- a first transistor pair comprising first and second differential transistors arranged in a Darlington configuration with the base of the first differential transistor connected to said circuit input, the collectors of both the first and second differential transistors connected to the first output of said differential amplifier stage, and the emitter of the first differential transistor connected to the base of the second differential transistor, a third output of said current supply means being connected to the emitter of the first differential transistor and drawing a third current therefrom; and
- a second transistor pair comprising third and fourth differential transistors arranged in a Darlington configuration with the base of the third differential transistor connected to ground, the collectors of both the third and fourth differential transistors connected to the second output of said differential amplifier stage, the emitter of the third differential transistor connected to the base of the fourth differential transistor, the emitter of the fourth differential transistor connected to the emitter of the second differential transistor and a fourth output of said current supply means connected to the emitter of said third differential transistor and drawing a fourth current therefrom, said first, second, third and fourth currents being locked in a substantially constant ratio.

3. An amplifier as claimed in claim 1 wherein said output stage comprises:
- a first output transistor having its collector connected to the output of said amplifier circuit and its emitter connected to a third reference potential;
- second and third output transistors arranged in a Darlington configuration with the base of said second output transistor connected to the input of said output stage, the collectors of said second and third output transistors connected to a fourth reference potential and the emitter of said second output transistor connected to the base of said third output transistor;
- a first output resistance connected between the base and emitter of said third output transistor;
- a voltage level shift circuit having its input connected to the emitter of said third output transistor and its output connected to the base of said first output transistor; and
- a second output resistance connected between the base and emitter of said first output transistor.

4. An amplifier circuit as claimed in claim 3 further including
- a first capacitor connected between said circuit input and the emitter of said second transistor of said common base stage;
- a second capacitor connected between the collector of said second transistor of said common base stage and the base of the first output transistor; and
- a third capacitor connected between the second output of said differential amplifier stage and a fifth reference potential.

5. An amplifier circuit as claimed in claim 1 further including a current amplifier in parallel with said second resistor.

6. An amplifier circuit as claimed in claim 5 wherein said current amplifier is a cross-coupled amplifier comprising:
- a first current amplifier transistor having its collector connected to the emitter of the second transistor of said common base stage and its base connected to a sixth reference potential;
- a second current amplifier transistor having its base connected to the second output of said input differential amplifier stage and its emitter connected to the emitter of said first current amplifier transistor;
- a first current amplifier resistor connected between the emitter of said second current amplifier transistor and a seventh reference potential; and
- a second current amplifier resistor connected between the collector of said second current amplifier transistor and the base of said first current amplifier transistor, said second current amplifier resistor having substantially the same resistance as said first circuit resistance.

7. An amplifier circuit as claimed in claim 5 wherein said current amplifier is a cross-coupled amplifier comprising:

a first current amplifier transistor having its collector connected to the emitter of the second transistor of said common base stage and its base connected to the first output of said input differential amplifier stage;

a second current amplifier transistor having its collector connected to the emitter of the first transistor of said common base stage, its base connected to the second output of said input differential amplifier stage, and its emitter connected to the emitter of said first current amplifier transistor; and a first amplifier resistor connected between the emitter of said second current amplifier transistor and a eighth reference potential.

8. A circuit as claimed in claim 5 wherein said amplifier circuit is a monolithic semiconductor integrated amplifier.

9. A monolithic semiconductor integrated amplifier as claimed in claim 8, further including first and second feedback resistors arranged in series between the input and output of said circuit, thereby permitting testing of the amplifier without the addition of an external feedback resistor.

10. A monolithic semiconductor integrated amplifier as claimed in claim 8, further including a voltage regulating means for generating the various reference potentials required in the circuit from a single positive and a single negative power supply.

* * * * *